(12) United States Patent
Teng et al.

(10) Patent No.: US 6,723,210 B2
(45) Date of Patent: Apr. 20, 2004

(54) METHOD FOR IMPROVING PERFORMANCE OF SPUTTERING TARGET

(75) Inventors: Tun-Ho Teng, Taoyun (TW); Yung-Fu Chen, Pingtung (TW)

(73) Assignee: Hannstar Display Corp., Taipei (TW)

( * ) Notice: Subject to any disclaimer, the term of this patent is extended or adjusted under 35 U.S.C. 154(b) by 13 days.

(21) Appl. No.: 10/255,298

(22) Filed: Sep. 26, 2002

(65) Prior Publication Data

US 2003/0146087 A1 Aug. 7, 2003

(30) Foreign Application Priority Data

Feb. 7, 2002 (TW) ....................................... 91102283 A

(51) Int. Cl.⁷ .............................................. C23C 14/35
(52) U.S. Cl. ............................ 204/192.22; 204/192.12; 204/192.13; 204/192.15
(58) Field of Search ....................... 204/192.12, 192.13, 204/192.15, 192.22, 298.08, 298.2, 298.22

(56) References Cited

U.S. PATENT DOCUMENTS 6,413,382 B1 * 7/2002 Wang et al. ........... 204/192.12
6,425,988 B1 * 7/2002 Montcalm et al. ..... 204/192.13

* cited by examiner

*Primary Examiner*—Steven Versteeg
(74) *Attorney, Agent, or Firm*—Volpe and Koenig, P.C.

(57) ABSTRACT

A method for improving a performance of a sputtering target in a magnetron sputtering system having at least one magnet repetitively and retracingly scanning between two sides thereof and receiving a power input changing with a scanning position of the magnet is provided. The method includes the steps of stepwise reducing the power input while the magnet approaches a specific distance range near a retracing point, so as to reduce an erosion rate of the sputtering target by the magnetron sputtering system, and increasing the power input to a specific value while the magnet leaves the specific distance range, wherein the power input changes with the scanning position of the magnet, so as to improve the performance of the sputtering target.

24 Claims, 9 Drawing Sheets

METHOD FOR IMPROVING PERFORMANCE OF SPUTTERING TARGET

FIELD OF THE INVENTION

This invention relates to a method for improving a performance of a sputtering target, and more particularly to a method for improving a performance of a sputtering target in a magnetron sputtering system.

BACKGROUND OF THE INVENTION

During the semiconductor or TFT-LCD (Thin Film Transistor Liquid Crystal Display) manufacturing processes, a sputtering technology generally is used in a thin film deposition. According to the momentum transfer theory, the sputtering technology utilizes the ion of a plasma to be deposited on the deposition element with gas phase, so as to proceed with a thin film deposition.

Presently, the sputter for TFT-LCD is always a magnetron sputtering system. Please refer to FIG. 1 which shows a schematic view of the equipment of the general magnetron sputtering system. In the magnetron sputtering system, a magnet 10 is disposed behind a sputtering target 11 and actuated by a stepper motor. And a substrate 12 is deposited on a plane 13. The magnet 10 is a full-length rectangular form and scans repetitively and retracingly between the two sides of the sputtering target 11. When the magnet 10 approaches the retracing points near the two sides of the sputtering target 11, because of the mechanical efficiency of the stepper motor, the scanning velocity of the magnet 10 can not help but be reduced, even suspended. Thus, the magnetic field at the two sides of the sputtering target will be greater than that at the center thereof, so that the target erosion rate at the two sides of the sputtering target will also be specifically greater than that at the center thereof. This situation causes the restriction of the performance of the expensive sputtering target.

Please refer to FIG. 2 and Table 1. FIG. 2 illustrates an erosion depth measurement of a MoW (tungsten molybdate) alloy target which has been sputtered by a conventional sputter. And Table 1 illustrates a contract table of the same. Among these, the depth of the MoW alloy target 20 is 16 mm. As shown in FIG. 2 and Table 1, the ranges 21, 24, and 27 of the left retracing area 210 and the ranges 23, 26, and 29 of the right retracing area 211 of the MoW alloy target 20 have thicker erosion depth (erosion rate) than the ranges 22, 25, and 28 at the center thereof. Thus, the performance of the MoW alloy target 20 is only 34%.

TABLE 1

| Position | Erosion thickness (mm) | Position | Erosion thickness (mm) | Position | Erosion thickness (mm) |
| --- | --- | --- | --- | --- | --- |
| 21 | 13.34 | 22 | 9.00 | 23 | 14.87 |
| 24 | 10.46 | 25 | 4.39 | 26 | 10.46 |
| 27 | 14.47 | 28 | 8.64 | 29 | 12.99 |

Please refer to FIG. 3 and Table 2. FIG. 3 illustrates an erosion depth measurement of the Al (aluminum) target which has been sputtered by a conventional sputter. And Table 2 shows a contract table of the same. Among these, the depth of the Al target 30 is 16 mm. As shown in FIG. 3 and Table 2, the ranges 308, 307, 315, 322, 329, 337, 338, 309, 316, 323, 330, and 339 of the downside retracing area 32 and the ranges 302, 301, 310, 317, 324, 331, 332, 303, 311, 318, 325, and 333 of the upside retracing area 31 of the sputtered Al target 30 have thinner residue thickness than the other ranges 304, 312, 319, 326, 334, 305, 313, 320, 327, 335, 306, 314, 321, 328, and 336. Thus, the performance of the Al target 30 is only 33%.

TABLE 2

| Position | 301 | 302 | 303 | 304 | 305 | 306 | 307 | 308 |
| --- | --- | --- | --- | --- | --- | --- | --- | --- |
| Residue thickness (mm) | 6.2 | 3.9 | 1.9 | 8.7 | 8.4 | 8.5 | 1.4 | 3.6 |
| Position | 309 | 310 | 311 | 312 | 313 | 314 | 315 | 316 |
| Residue thickness (mm) | 6.4 | 5.6 | 4.6 | 10.9 | 11.1 | 10.8 | 5.1 | 6.0 |
| Position | 307 | 318 | 319 | 320 | 321 | 322 | 323 | 324 |
| Residue thickness (mm) | 6.2 | 4.7 | 11.2 | 11.8 | 11.2 | 4.8 | 6.0 | 6.0 |
| Position | 325 | 326 | 327 | 328 | 329 | 330 | 331 | 332 |
| Residue thickness (mm) | 5.2 | 11.0 | 11.3 | 11.1 | 4.5 | 6.1 | 6.4 | 3.6 |
| Position | 333 | 334 | 335 | 336 | 337 | 338 | 339 | |
| Residue thickness (mm) | 1.6 | 8.5 | 8.7 | 8.4 | 2.1 | 3.9 | 6.7 | |

Because of the defects described above, the applicant keeps on carving unflaggingly to develop "method for improving performance of sputtering target" through wholehearted experience and research.

SUMMARY OF THE INVENTION

It is an object of the present invention to provide a method for improving the performance of a magnetron sputtering system.

It is another object of the present invention to provide a stepwise power controlling method for complying with the scanning position of the magnet in the magnetron sputtering system.

According to an aspect of the present invention, a method for improving a performance of a sputtering target in a magnetron sputtering system having a magnet repetitively, and retracingly scanning between two sides thereof and receiving a power input changing with a scanning position of the magnet includes steps of stepwise reducing the power input while the magnet approaches a specific distance range near a retracing point, so as to reduce an erosion rate of the sputtering target by the magnetron sputtering system, and increasing the power input to a specific value while the magnet leaves the specific distance range, wherein the power input changes with the scanning position of the magnet, so as to improve the performance of the sputtering target.

Preferably, the method is a power changing method.

Preferably, the magnet is controlled by a stepping motor.

Preferably, the power input is supplied by a DC power supply.

Certainly, the power input can be changed by means of revising a computer program of the DC power supply.

Certainly, the power input can be changed by means of revising software of said magnetron sputtering system.

Preferably, the specific distance range has a direct proportion to a scan range of the magnet in magnitude.

Preferably, the sputtering target is made of one selected from a group consisting of an alloy, an oxide, and a metal.

Certainly, the alloy can be one of a tungsten molybdate (MoW) and a neodymium aluminate (AlNd).

Certainly, the oxide can be one of indium tin oxide (ITO) and indium zinc oxide (IZO).

Certainly, the metal can be one of chromium (Cr) and aluminum (Al).

Preferably, the power input is changed stepwise.

In accordance with another aspect of the present invention, a method for improving a performance of a sputtering target in a magnetron sputtering system having a magnet repetitively and retracingly scanning between two sides thereof and receiving a power input changing with a scanning position of the magnet includes steps of defining a scanning center at a substantially half position of a scanning range of the magnet, reducing the power input gradually while the magnet is moved from the scanning center to a retracing point, so as to reduce an erosion rate of the sputtering target by the magnetron sputtering system, and raising the power input gradually while the magnet is moved from the retracing point to the scanning center, wherein the power input changes with the scanning position of the magnet, so as to improve the performance of the sputtering target.

Preferably, the method is a power changing method.

Preferably, the magnet is controlled by a stepping motor.

Preferably, the power input is supplied by a DC power supply.

Certainly, the power input can be changed by means of revising a computer program of the DC power supply.

Certainly, the power input can be changed by means of revising software of said magnetron sputtering system.

Preferably, the scanning range of the magnet has a direct proportion to a distance from the retracing point in magnitude.

Preferably, the sputter target is made of one selected from a group consisting of an alloy, an oxide, and a metal.

Certainly, the alloy can be one of a tungsten molybdate (MoW) and a neodymium aluminate (AlNd).

Certainly, the oxide can be one of indium tin oxide (ITO) and indium zinc oxide (IZO).

Certainly, the metal can be one of chromium (Cr) and aluminum (Al).

Preferably, the power input is changed stepwise.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1:
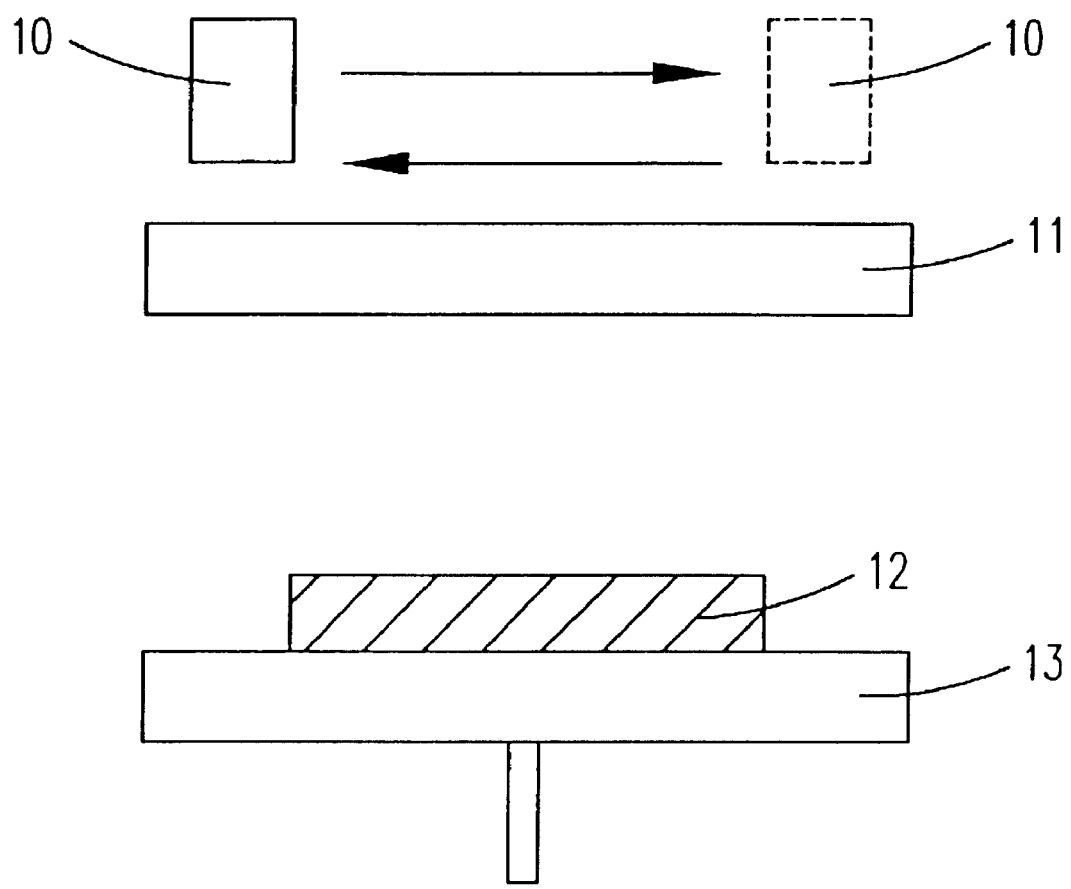
FIG. 1 is a schematical view showing an equipment of a conventional magnetron sputtering system.
Figure 2:
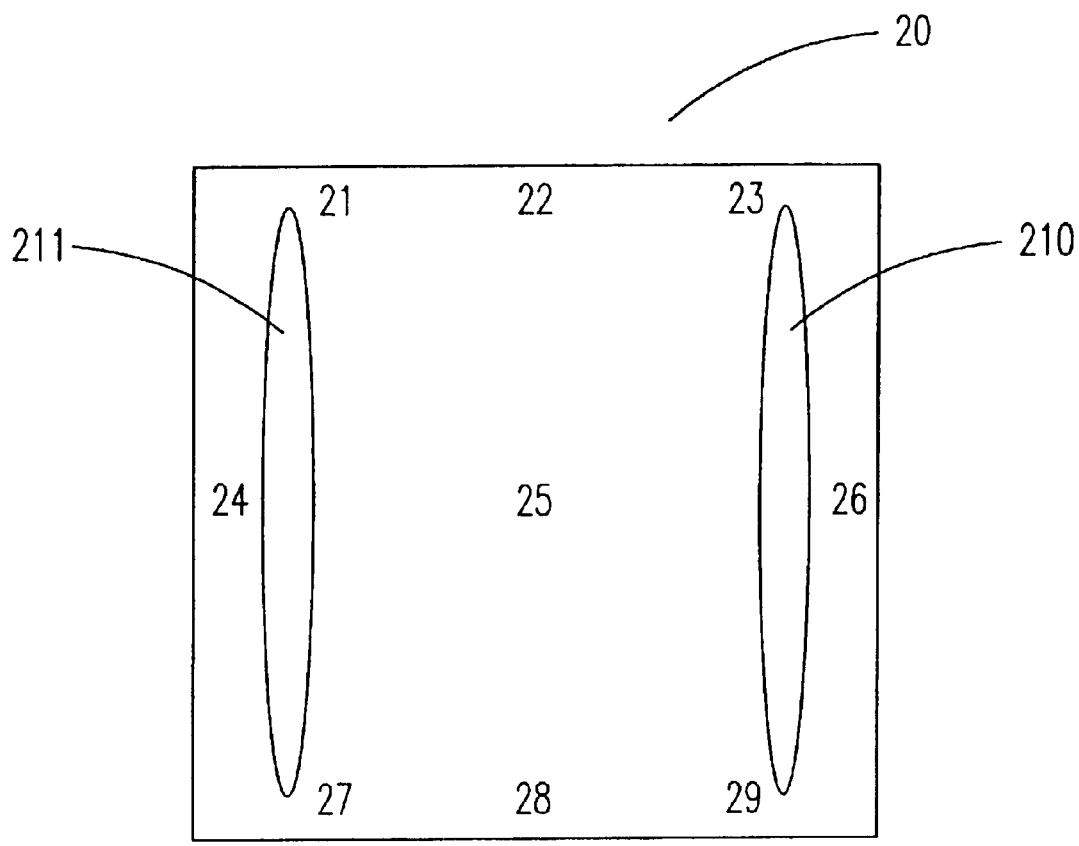
FIG. 2 is shows an erosion depth measurement of a MoW alloy target which is sputtered by a conventional sputter.
Figure 3:
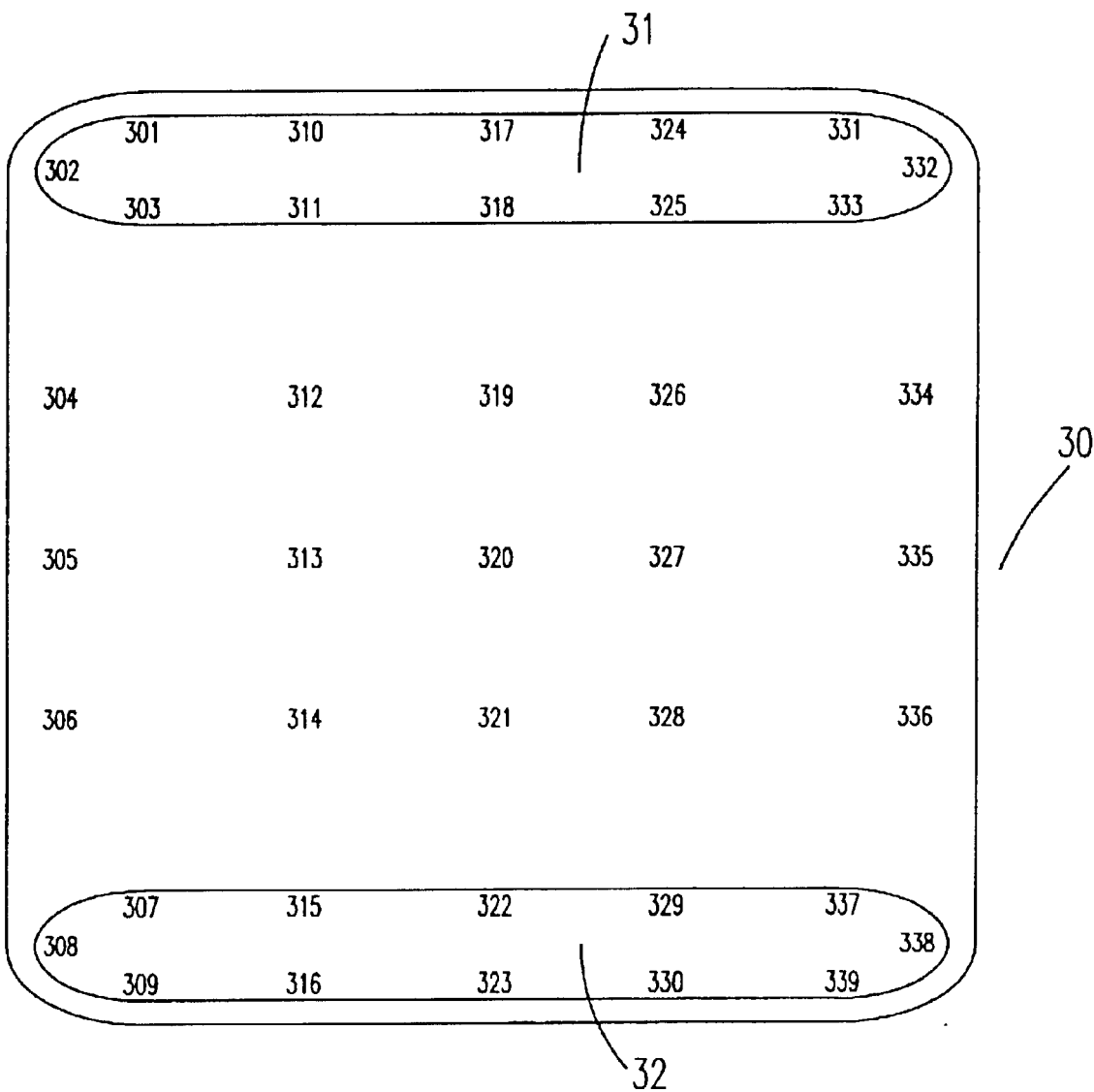
FIG. 3 is shows a measurement of the residue thickness of an Al target which is sputtered by a conventional sputter.
Figure 4:
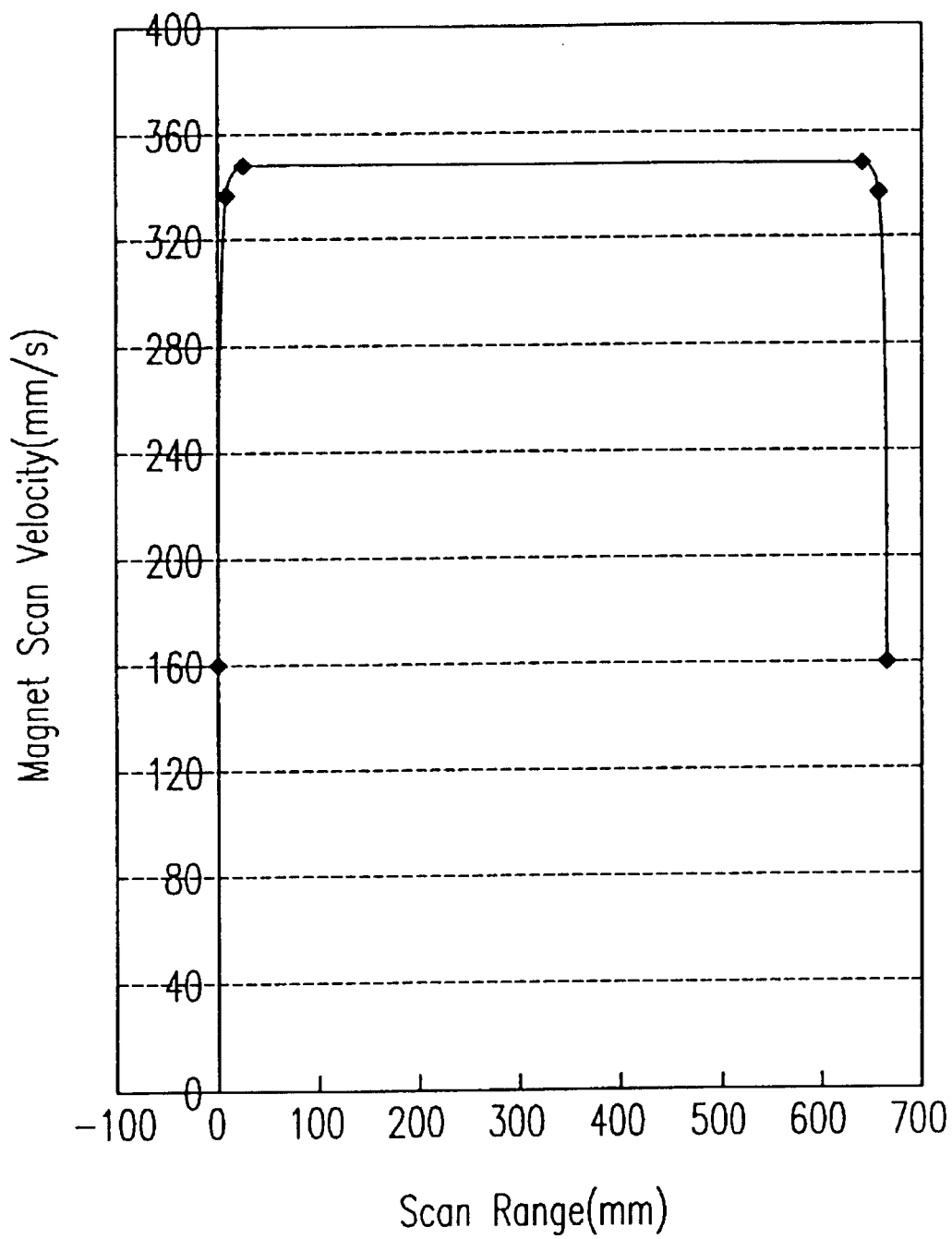
FIG. 4 is a comparative plot of the scanning velocity and the scanning range of the magnet in the magnetron sputtering system according to the Al target in FIG. 3.

Please refer to FIG. 4 which illustrates a comparative plot of the scanning velocity and the scanning range of the magnet in the magnetron sputtering system according to the Al target in FIG. 3, wherein the scanning range of the magnet is 670 mm. According to FIG. 4, when the magnet approaches the retracing points near the two sides of the sputtering target, because of the mechanical efficiency of the stepper motor which controls the movement of the magnet, the scanning velocity of the magnet can not help but be reduced, even suspended. As shown in FIG. 4, while the magnet is 15 mm far from the two-side retracing areas, the scanning velocity of the magnet is reduced from 350 mm/s to 340 mm/s. Furthermore, while the magnet is 5 mm far from the two-side retracing areas, the scanning velocity of the magnet is reduced from 340 mm/s to 160 mm/s.

Figure 5:
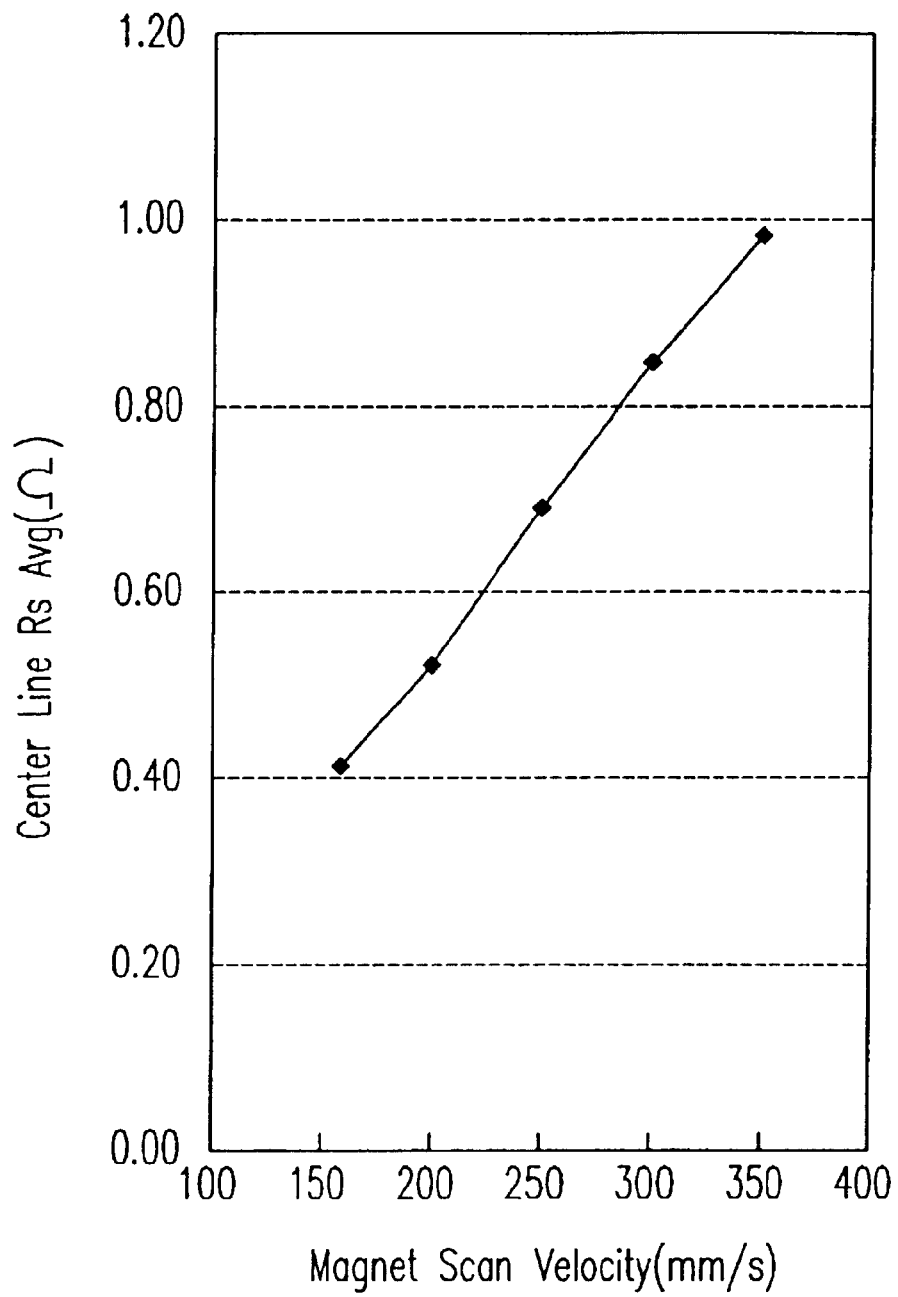
FIG. 5 is a comparative plot of the center line resistance average of the substrate and the scanning velocity of the magnet in the magnetron sputtering system according to the Al target in FIG. 3.
Figure 6:
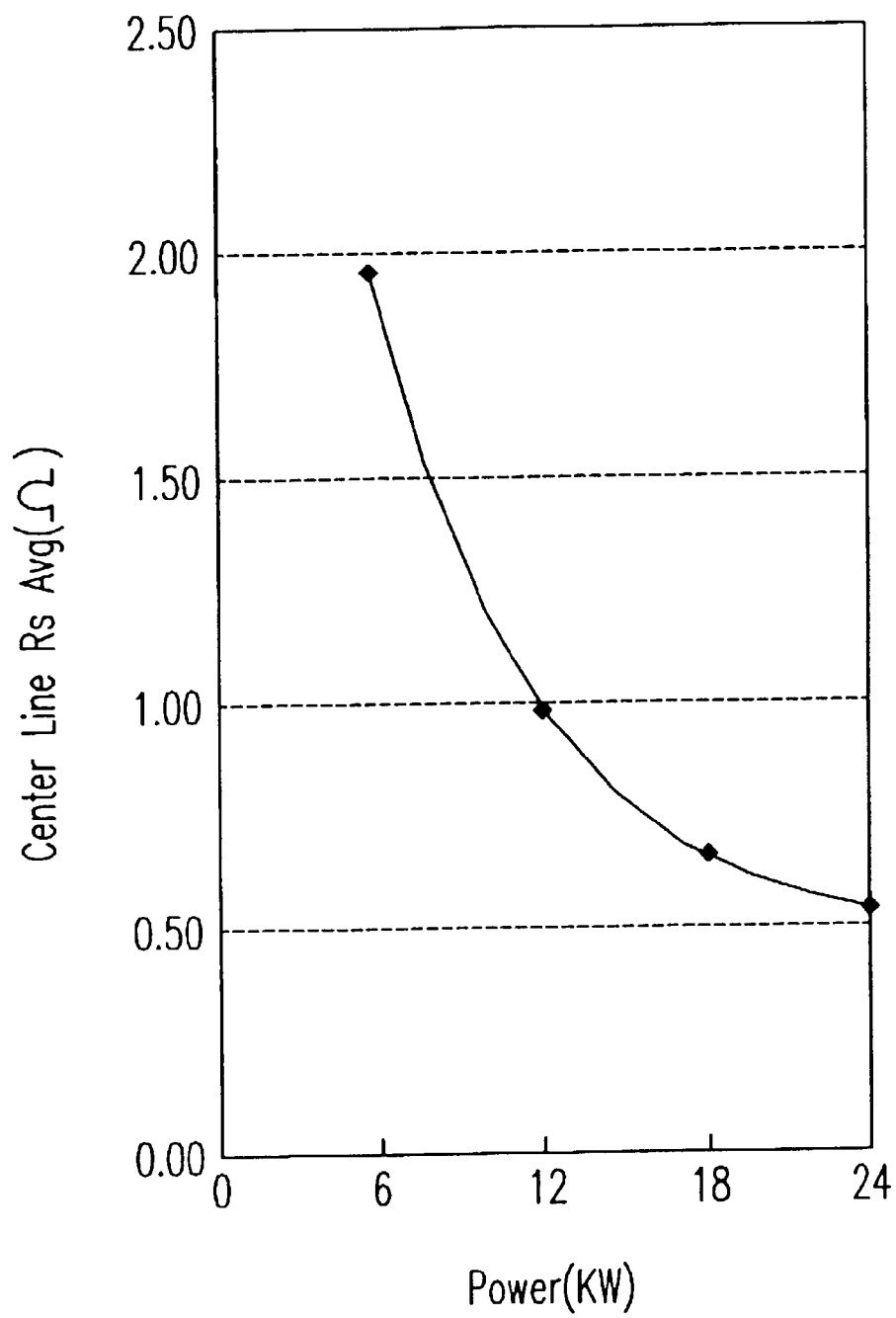
FIG. 6 is a comparative plot of the center line resistance average of the substrate in the magnetron sputtering system and the power of the magnet according to the Al target in FIG. 3.
Figure 7:
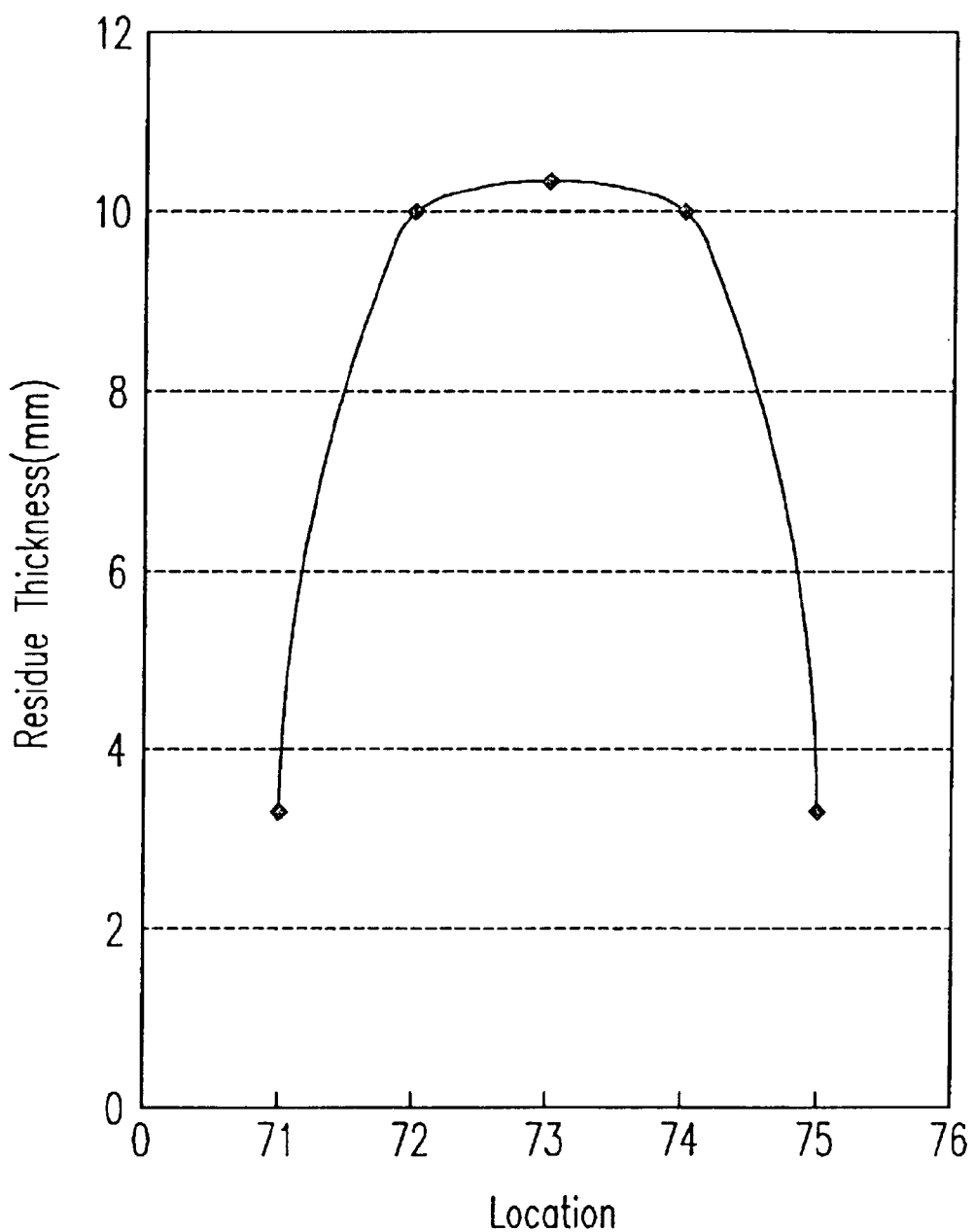
FIG. 7 is a schematic view of the residue thickness of the sputtered sputtering target in the magnetron sputtering system according to the Al target in FIG. 3.

Please refer to FIGS. 5~7. FIG. 5 illustrates a comparative plot of the center line resistance average of the substrate and the scanning velocity of the magnet in the magnetron sputtering system according to the Al target in FIG. 3. FIG. 6 illustrates a comparative plot of the center line resistance average of the substrate in the magnetron sputtering system and the power of the magnet according to the Al target in FIG. 3. FIG. 7 illustrates a schematical view of the residue thickness of the sputtered sputtering target in the magnetron sputtering system. The erosion rate at the two sides of the sputtering target is 2.87 times of that at the center thereof. The reasons why are described as follows:

First, the velocity reducing effect of the magnet, as shown in FIG. 4, the scanning velocity of the magnet at the two sides of the sputtering target is 160 mm/s, and that at the center is 350 mm/s. Thus, the scanning velocity at the two sides is only 45.71% of that at the center. According to FIG. 5, when the scanning velocity of the magnet is slower, the center line resistance average of the substrate will become lower, and then the deposited thickness on the substrate becomes thicker. That means if the erosion rate of the target becomes greater, the residue thickness of the target will become thinner, and the relationship between the two conform to a liner function. As shown in FIG. 6, when the input power is higher, the center line resistance average of the substrate becomes lower, so that the residue thickness of the target will become thinner, too. To be conjectured, the lower the scanning rate of the magnet, the greater the erosion rate of the sputtering target. Thus, the erosion rate at the sides of the sputtering target would be 2.19 times of that at the center (only considering the velocity reducing effect).

Second, the suspension effect of the magnet: while the magnet approaches the two sides of the target, the intensity of the magnetic field will also be increased by the increased suspension time of the magnet and this will make the erosion more seriously. The general formula of the suspension time is $$\Delta T = \frac{T - T_0}{2N - 1},$$

wherein $\Delta T$ is the suspension time, T is the sum film deposition time, $T_0$ is the sum scanning time of the magnet, and N is the scanning number of the magnet. Because of the velocity reducing effect and the suspension effect, the erosion rate at the two sides of the target is 2.87 times of that at the center.

Figure 8:
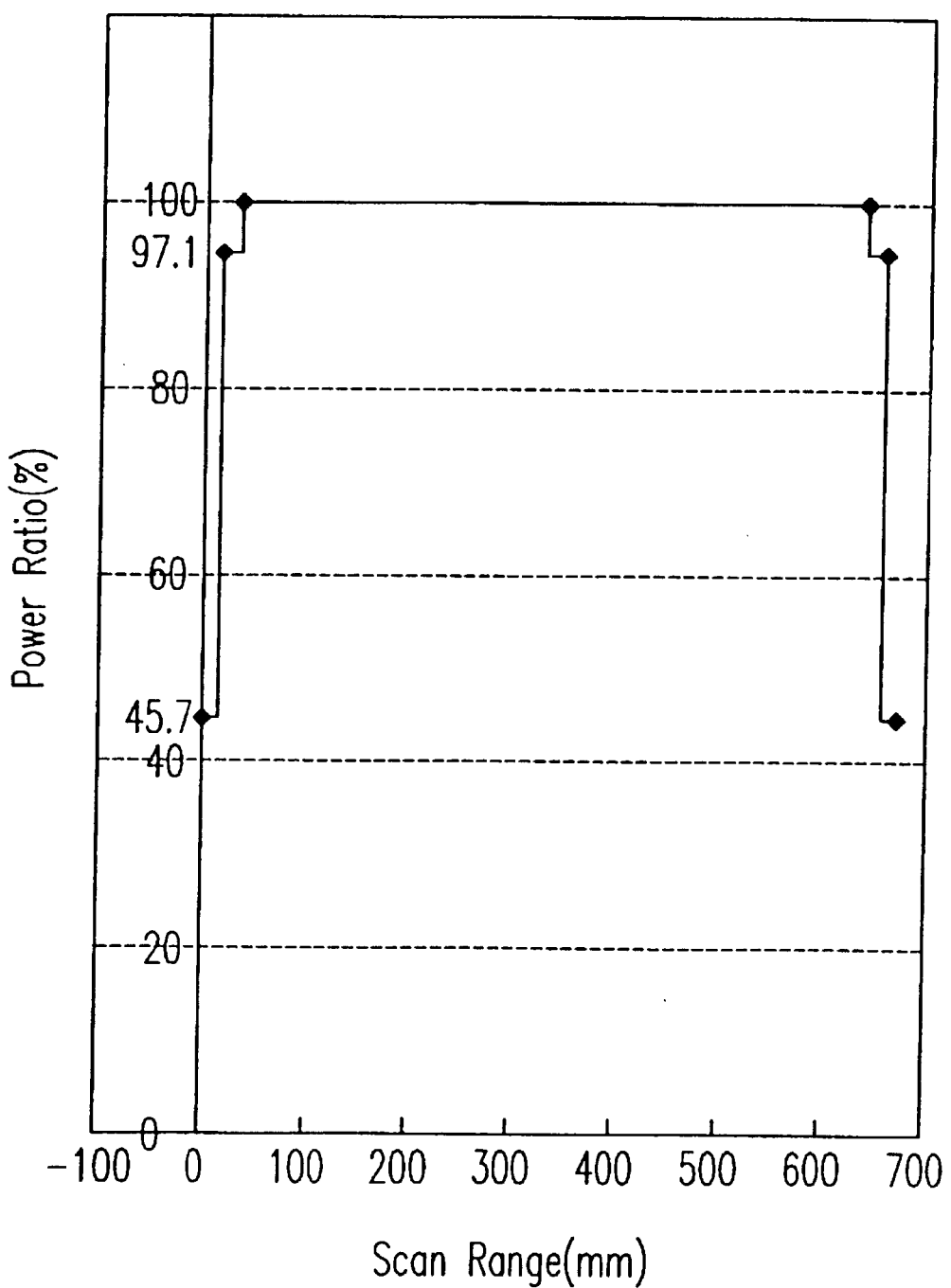
FIG. 8 is a comparative plot of the power input and the scanning range in a preferred embodiment according to the present invention.

For improving the performance of the sputtering target, the present invention utilizes a method which changes the power input to comply with the scanning range of the magnet. Please refer to FIG. 8 which illustrates a comparative plot of the power input and the scanning range in a preferred embodiment according to the present invention. The method disclosed in FIG. 8 includes the steps of stepwise reducing the power input while the magnet approaches a specific distance range near a retracing area, so as to reduce an erosion rate of the sputtering target by the magnetron sputtering system, and increasing the power input to a specific value while the magnet leaves the specific distance range, wherein the power input changes with the scanning position of the magnet, so as to improve the performance of the sputtering target. And this method is a stepwise changed method. While the magnet is 15 mm far from the retracing area, the power input is firstly reduced to 97.1%, and while the magnet is 5 mm far from the retracing area, the power input is secondly reduced to 45.7%, wherein the power input is supplied by a DC power supply and can be changed by means of revising a computer controlling program of the DC power supply or software of sputtering system. According to the stepwise power changed method in FIG. 8, the performance of the sputtering target can be raised about 30%.

Figure 9:
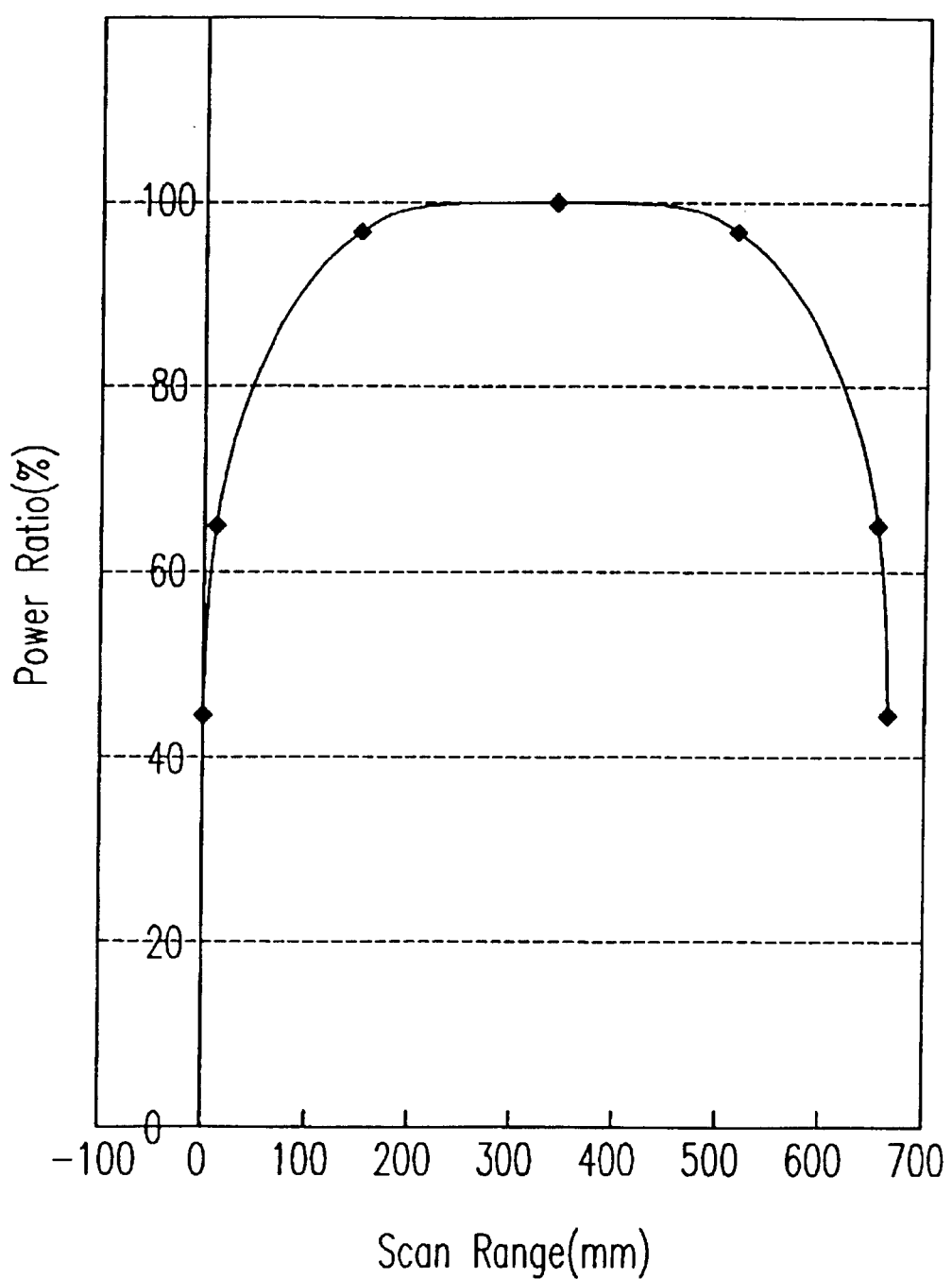
FIG. 9 is a comparative plot of the power input and the scanning range in another preferred embodiment according to the present invention.

Please refer to FIG. 9. FIG. 9 illustrates a comparative plot of the power input and the scanning range in another preferred embodiment according to the present invention. The method illustrated in FIG. 9 includes steps of defining a scanning center at a substantially half position of a scanning range of the magnet, reducing the power input gradually while the magnet is moved from the scanning center to a retracing point, so as to reduce an erosion rate of the sputtering target by the magnetron sputtering system, and raising the power input gradually while the magnet is moved from the retracing point to the scanning center, wherein the power input changes with the scanning position of the magnet, so as to improve the performance of the sputtering target. The scanning center in FIG. 9 is at a substantially half position of the 670 mm scanning range, in other words, a position at about 350 mm, and the power input is maximized at this position. The power input is supplied by a DC power supply and can be changed by means of revising a computer controlling program of the DC power supply or software of sputtering system. According to the stepwise power changed method in FIG. 9, the performance of the sputtering target can be raised about 30%.

In view of the aforesaid, the present invention improves the performance of the sputtering target in a magnetron sputtering system, economizes the unit cost of the material used in the sputtering target, reduces the frequency of changing the sputtering target, and improves the defect in the prior art. Thus, the present invention is advanced and novel and is practical for the industries.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for improving a performance of a sputtering target in a magnetron sputtering system having a magnet repetitively and retracingly scanning between two sides thereof and receiving a power input changing with a scanning position of said magnet, comprising steps of:
   stepwise reducing said power input while said magnet approaches a specific distance range near a retracing point, so as to reduce an erosion rate of said sputtering target by said magnetron sputtering system; and
   increasing said power input to a specific value while said magnet leaves said specific distance range, wherein said power input changes with said scanning position of said magnet, so as to improve said performance of said sputtering target.

2. A method according to claim 1 wherein said method is a power changing method.

3. A method according to claim 1 wherein said magnet is controlled by a stepping motor.

4. A method according to claim 1 wherein said power input is supplied by a DC power supply.

5. A method according to claim 4 wherein said power input is changed by means of revising a computer program of said DC power supply.

6. A method according to claim 4 wherein said power input is changed by means of revising software of said magnetron sputtering system.

7. A method according to claim 1 wherein said specific distance range has a direct proportion to a scan range of said magnet in magnitude.

8. A method according to claim 1 wherein said sputtering target is made of one selected from a group consisting of an alloy, an oxide, and a metal.

9. A method according to claim 8 wherein said alloy is one of a tungsten molybdate (MoW) and a neodymium aluminate (AlNd).

10. A method according to claim 8 wherein said oxide is one of indium tin oxide (ITO) and indium zinc oxide (IZO).

11. A method according to claim 8 wherein said metal is one of chromium (Cr) and aluminum (Al).

12. A method according to claim 1 wherein said power input is changed stepwise.

13. A method for improving a performance of a sputtering target in a magnetron sputtering system having a magnet repetitively and retracingly scanning between two sides thereof and receiving a power input changing with a scanning position of said magnet, comprising steps of:
   defining a scanning center at a substantially half position of a scanning range of said magnet;
   reducing said power input gradually while said magnet is moved from said scanning center to a retracing point, so as to reduce an erosion rate of said sputtering target by said magnetron sputtering system; and
   raising said power input gradually while said magnet is moved from said retracing point to said scanning center, wherein said power input changes with said scanning position of said magnet, so as to improve said performance of said sputtering target.

14. A method according to claim 13 wherein said method is a power changing method.

15. A method according to claim 13 wherein said magnet is controlled by a stepping motor.

16. A method according to claim 13 wherein said power input is supplied by a DC power supply.

17. A method according to claim 16 wherein said power input is changed by means of revising a computer program of said DC power supply.

18. A method according to claim 16 wherein said power input is changed by means of revising software of said magnetron sputtering system.

19. A method according to claim 13 wherein said scanning range of said magnet has a direct proportion to a distance from said retracing point in magnitude.

20. A method according to claim 13 wherein said sputter target is made of one selected from a group consisting of an alloy, an oxide, and a metal.

21. A method according to claim 20 wherein said alloy is one of a tungsten molybdate (MoW) and a neodymium aluminate (AlNd).

22. A method according to claim 20 wherein said oxide is one of indium tin oxide (ITO) and indium zinc oxide (IZO).

23. A method according to claim 20 wherein said metal is one of chromium (Cr) and aluminum (Al).

24. A method according to claim 13 wherein said power input is changed stepwise.

* * * * *